(12) United States Patent
Kim (10) Patent No.: US 12,470,202 B2
(45) Date of Patent: Nov. 11, 2025

(54) NOISE REDUCTION CIRCUIT AND BATTERY MANAGEMENT DEVICE COMPRISING SAME

(71) Applicant: LG ENERGY SOLUTION, LTD., Seoul (KR)

(72) Inventor: Jaehwan Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 18/272,879

(22) PCT Filed: Sep. 13, 2022

(86) PCT No.: PCT/KR2022/013613
§ 371 (c)(1),
(2) Date: Jul. 18, 2023

(87) PCT Pub. No.: WO2023/063592
PCT Pub. Date: Apr. 20, 2023

(65) Prior Publication Data
US 2023/0412150 A1  Dec. 21, 2023

(30) Foreign Application Priority Data
Oct. 15, 2021 (KR) ........................ 10-2021-0137090

(51) Int. Cl.
*H03H 11/04* (2006.01)
*H02J 7/00* (2006.01)

(52) U.S. Cl.
CPC ............ *H03H 11/04* (2013.01); *H02J 7/0047* (2013.01)

(58) Field of Classification Search
CPC ............................... H02J 7/0047; H03H 11/04
See application file for complete search history.

(56) References Cited

U.S. PATENT DOCUMENTS

2006/0170506 A1* 8/2006 Youssoufian ......... H03L 7/0991
331/36 C
2007/0236281 A1  10/2007 Cicalini
(Continued)

FOREIGN PATENT DOCUMENTS

DE    102018115598 A1 *  1/2019  ............. H03H 11/04
FR       3083187 A1 *  1/2020  ........... B60R 16/005
(Continued)

OTHER PUBLICATIONS

Japanese Office Action for Japanese Application No. 2023-547300, dated Sep. 9, 2024, with English translation.
(Continued)

*Primary Examiner* — Daniel C Puentes
(74) *Attorney, Agent, or Firm* — Birch, Stewart, Kolasch & Birch, LLP (57) ABSTRACT

A noise reduction circuit may comprise a first circuit including at least one resistance element and a first capacitor, and connected to an analog-to-digital converter; and a second circuit connected in parallel with the first capacitor and connected to the analog-to-digital converter through one or more input/output pins, wherein the second circuit is activated or deactivated according to control of the analog-to-digital converter, so that a noise cutoff frequency generated by the first circuit and the second circuit is adjusted.

12 Claims, 5 Drawing Sheets

(56) References Cited

U.S. PATENT DOCUMENTS

| | | | |
|---|---|---|---|
| 2009/0002206 A1* | 1/2009 | Kremin | H03K 17/962 |
| | | | 341/33 |
| 2013/0002460 A1 | 1/2013 | Panigada et al. | |
| 2014/0036974 A1 | 2/2014 | Min et al. | |
| 2014/0104132 A1 | 4/2014 | Bakalski et al. | |
| 2015/0162759 A1 | 6/2015 | Fujii et al. | |
| 2015/0276891 A1 | 10/2015 | Hikichi et al. | |
| 2018/0299510 A1 | 10/2018 | Park et al. | |
| 2020/0235599 A1 | 7/2020 | Akao | |
| 2021/0313969 A1 | 10/2021 | Crandell | |
| 2022/0131529 A1 | 4/2022 | Goossens et al. | |
| 2022/0283244 A1 | 9/2022 | Honda et al. | |

FOREIGN PATENT DOCUMENTS

| | | |
|---|---|---|
| JP | 8-327710 A | 12/1996 |
| JP | 2010-243157 A | 10/2010 |
| JP | 2014-64404 A | 4/2014 |
| JP | 2015-184172 A | 10/2015 |
| JP | 2019-506594 A | 3/2019 |
| JP | 2021-143864 A | 9/2021 |
| JP | 2021-528316 A | 10/2021 |
| KR | 10-0760076 B1 | 9/2007 |
| KR | 10-0777006 B1 | 11/2007 |
| KR | 10-2009-0025203 A | 3/2009 |
| KR | 10-1027965 B1 | 4/2011 |
| KR | 10-1365311 B1 | 2/2014 |
| KR | 10-2014-0025565 A | 3/2014 |
| KR | 10-2014-0047554 A | 4/2014 |
| KR | 10-1922018 B1 | 11/2018 |
| KR | 10-2020-0060291 A | 5/2020 |
| KR | 10-2020-0089637 A | 7/2020 |
| KR | 10-2021-0057103 A | 5/2021 |
| KR | 10-2021-0117286 A | 9/2021 |
| KR | 10-2021-0119092 A | 10/2021 |
| KR | 10-2023-0077365 A | 6/2023 |
| WO | WO-2018085972 A1 * 5/2018 | ............ G01D 5/24 |
| WO | WO 2019/123904 A1 | 6/2019 |
| WO | WO 2020/002672 A1 | 1/2020 |
| WO | WO 2021/111822 A1 | 6/2021 |

OTHER PUBLICATIONS

International Search Report (PCT/ISA/210) issued in PCT/KR2022/013613 mailed on Jan. 4, 2023.

Extended European Search Report for European Application No. 22881221.0, dated Mar. 4, 2025.

* cited by examiner

RELATED ART

NOISE REDUCTION CIRCUIT AND BATTERY MANAGEMENT DEVICE COMPRISING SAME

TECHNICAL FIELD

This application claims priority to and the benefit of Korean Patent Application No. 10-2021-0137090 filed in the Korean Intellectual Property Office on Oct. 15, 2021, the entire contents of which are incorporated herein by reference.

The present invention relates to a noise reduction circuit and a battery management apparatus including the same, and more particularly, to a noise reduction circuit for providing a variable cutoff frequency through control of a capacitor capacity of an RC filter and a battery management apparatus including the noise reduction circuit.

BACKGROUND ART

Secondary batteries are batteries that can be recharged and reused repeatedly. Secondary batteries are typically manufactured as a battery module or a battery pack formed by connecting a plurality of battery cells in series according to an output capacity required by a device to be used as power supply sources for various devices. Such batteries are being used in various fields ranging from small high-tech electronic devices such as smart phones to electric bicycles, vacuum cleaners, electric vehicles (EVs, Light EVs), and energy storage systems (ESS).

A battery module or battery pack is a structure in which a plurality of battery cells are combined. When overvoltage, overcurrent, or overheating occurs in some battery cells, a problem occurs in safety and operating efficiency of the entire battery module or battery pack. Thus, a means for detecting these problems are essential. Accordingly, a battery module or battery pack is equipped with a battery management system (BMS) that measures a voltage value of each battery cell and monitors and controls a voltage state of the battery cells based on measured values.

Here, a process of converting an analog value measured through monitoring into a digital value, i.e., an Analog-to-Digital Converting (ADC) is required in order to detect states of battery cells and determine an abnormal situation. However, when frequencies to be blocked differ depending on an environment in which the device is installed and designing in consideration of frequency noise in various installation environments is needed, a problem occurs that accuracy of an ADC operation is reduced, and thus, an appropriate solution is required.

SUMMARY

Technical Problem

Embodiments of the present disclosure provide a noise reduction circuit.

Embodiments of the present disclosure also provide a battery management apparatus including the noise reduction circuit.

Technical Solution

In order to achieve the objective of the present disclosure, a noise reduction circuit may comprise a first circuit including at least one resistance element and a first capacitor, and connected to an analog-to-digital converter; and a second circuit connected in parallel with the first capacitor and connected to the analog-to-digital converter through one or more input/output pins, wherein the second circuit is activated or deactivated according to control of the analog-to-digital converter, so that a noise cutoff frequency generated by the first circuit and the second circuit is adjusted.

The second circuit may include a second capacitor connected in parallel with the first capacitor; and a switch positioned between the second capacitor and a ground, wherein the second capacitor and the switch are connected to the analog-to-digital converter through the one or more input/output pins.

The one or more input/output pins may include: a first general-purpose input/output (GPIO) for connecting the analog-to-digital converter and the second capacitor; and a second GPIO for connecting the analog-to-digital converter and the switch.

A first noise cutoff frequency generated by the first circuit may differ from a second noise cutoff frequency generated by the first circuit and the second circuit.

A first resistance element among the at least one resistance element of the first circuit and the first capacitor may be connected to the analog-to-digital converter through the first GPIO.

Here, the switch may be a field effect transistor (FET) or a bipolar junction transistor (BJT).

According to another embodiment of the present disclosure, a battery management apparatus may comprise an analog-to-digital converter including one or more input/output pins; and a noise reduction circuit including a first circuit and a second circuit, the first circuit including at least one resistance element and a first capacitor, wherein the second circuit is connected in parallel with the first capacitor and connected to the analog-to-digital converter through the one or more input/output pins, wherein the second circuit is activated or deactivated according to control of the analog-to-digital converter, so that a noise cutoff frequency generated by the first circuit and the second circuit is adjusted.

The second circuit may include a second capacitor connected in parallel with the first capacitor; and a switch positioned between the second capacitor and a ground, wherein the second capacitor and the switch are connected to the analog-to-digital converter through the one or more input/output pins.

The one or more input/output pins may include: a first general-purpose input/output (GPIO) for connecting the analog-to-digital converter and the second capacitor; and a second GPIO for connecting the analog-to-digital converter and the switch.

The analog-to-digital converter may further include a controller configured to determine a cut-off frequency according to frequency noise of an environment in which the battery management device is located, and determine whether to activate the second circuit according to the determined cut-off frequency.

Here, the controller may transmit an activation signal or a deactivation signal for the second circuit to a switch of the second circuit through the second GPIO.

The analog-to-digital converter may be included in a micro controller Unit (MCU) or in a battery monitoring integrated chip (BMIC).

Advantageous Effects

According to embodiments of the present disclosure, it is possible to variably control a cut-off frequency of an RC filter according to an environment in which it is necessary to secure analog-to-digital converting (ADC) performance or an environment in which low-frequency noise reduction is required.

Accordingly, performance improvement and convenience increase can be expected in a battery management system (BMS) performing analog-to-digital converting.

DETAILED DESCRIPTION

The present invention may be modified in various forms and have various embodiments, and specific embodiments thereof are shown by way of example in the drawings and will be described in detail below. It should be understood, however, that there is no intent to limit the present invention to the specific embodiments, but on the contrary, the present invention is to cover all modifications, equivalents, and alternatives falling within the spirit and technical scope of the present invention. Like reference numerals refer to like elements throughout the description of the figures.

It will be understood that, although the terms such as first, second, A, B, and the like may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes combinations of a plurality of associated listed items or any of the plurality of associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be described in detail with reference to the accompanying drawings.

Figure 1:
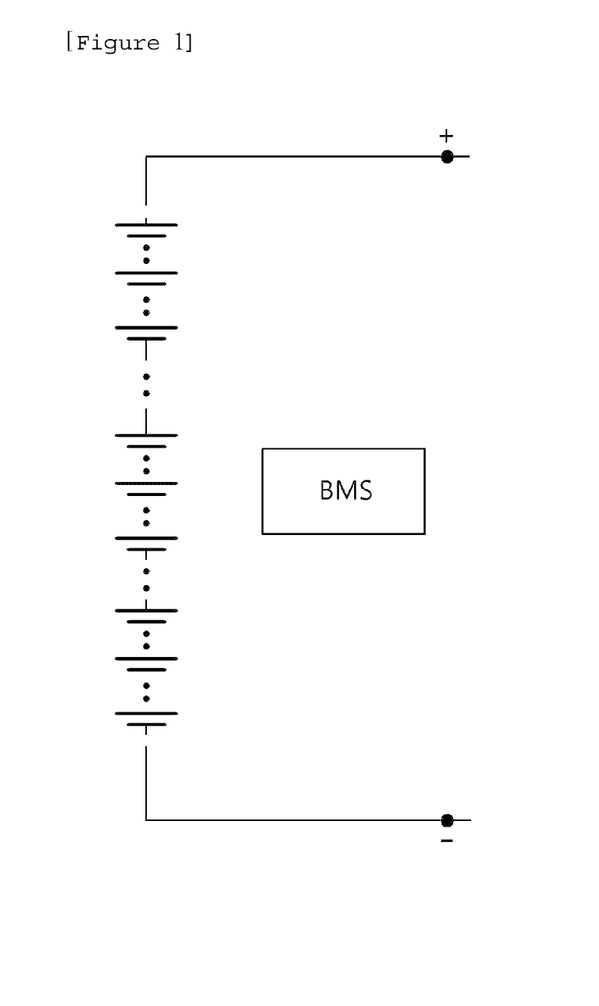
FIG. 1 shows a structure of a battery system to which the present invention may be applied.

FIG. 1 shows a structure of a battery system to which the present invention may be applied.

In FIG. 1, a battery pack or battery module may include a plurality of battery cells connected in series. The battery pack or module may be connected to a load through a positive terminal and a negative terminal to perform charging or discharging.

A battery management system (BMS) 100 may be installed in a battery module or battery pack. The BMS may monitor a current, a voltage and a temperature of each battery pack to be managed, calculate a state of charge (SOC) of the battery based on monitoring results to control charging and discharging. Here, the State of Charge (SOC) refers to a current state of charge of a battery, represented in percent points, and the State of Health (SOH) may be a current condition of a battery compared to its ideal conditions, represented in percent points.

The BMS 100 may include various components such as a fuse, a current sensing element, a thermistor, a switch, and a balancer to perform such operations. In most cases, a micro controller unit (MCU) or a battery monitoring integrated chip (BMIC) for interworking and controlling these components is additionally included in the BMS. Here, the BMIC may be located inside the BMS and may be an integrated circuit (IC) type component that measures information such as voltage, temperature, and current of a battery cell/module.

Meanwhile, in order for the BMS to detect the state of the battery cell and determine an abnormal situation, an analog-to-digital converting (ADC) operation for converting an analog value measured through monitoring into a digital value is required.

In a conventional case, an ADC operation is performed by an MCU or a BMIC, which performs ADC conversion for voltage, current, and temperature values that are input through general-purpose input/output (GPIO) pins of the MCU or the BMIC. Here, an RC (Resistor-Capacitor) filter is used to reduce frequency noise of a voltage signal or a temperature signal input through the general-purpose input/output (GPIO) pins.

Figure 2:
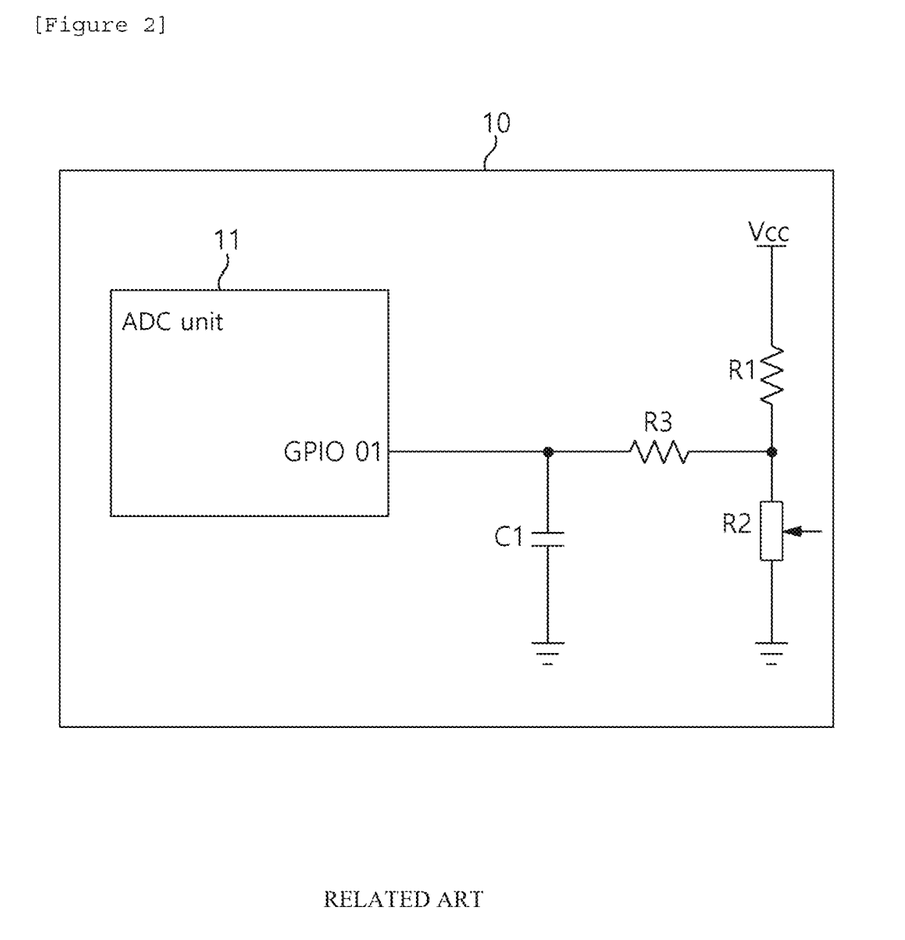
FIG. 2 shows a noise reduction circuit applied to a conventional analog-to-digital converter.

FIG. 2 shows a noise reduction circuit applied to a conventional analog-to-digital converter.

Referring to FIG. 2, the BMS 10 may include an ADC operation unit 11. The ADC operation unit 11 may be a BMIC or MCU, and may include a plurality of GPIO pins. In FIG. 2, GPIO 01 pin is used for ADC operation. The ADC operation unit converts measured analog signals, such as cell voltages and resistance values, into digital values.

In the example of FIG. 2, a thermistor R2 is used as a battery cell-related monitoring target. A noise reduction circuit including a resistor and a capacitor is disposed between R2 (monitoring target) and GPIO 01 pin of the ADC operation unit 11.

The conventional noise reduction circuit shown in FIG. 2 includes one capacitor C1 and one or more resistors R3. More specifically, the noise reduction circuit may be configured to have resistor R1, resistor R3 and capacitor C1, wherein one side of resistor R1 is connected to a power supply (Vcc) and the other side of resistor R1 is connected to one side of resistor R2 (PTC or NTC element), wherein one side of resistor R3 is connected to a connection point of resistor R1 and resistor R2 and the other side of resistor R3 is connected to the GPIO pin, and wherein capacitor C1 is connected to the GPIO pin and the ground.

Here, the thermistor may be a positive temperature coefficient (PTC) thermistor or a negative temperature coefficient (NTC) thermistor.

A positive temperature coefficient (PTC) thermistor is a semiconductor device having a characteristic in which a resistance value changes according to temperature. As the temperature rises, the resistance value increases, and as the temperature decreases, the resistance value decreases. A negative temperature coefficient (NTC) thermistor also has a characteristic that its resistance value changes according to temperature, but, opposite to the PTC. The NTC thermistor has a characteristic that the resistance value decreases when the temperature rises and the resistance value increases when the temperature decreases.

In this conventional noise reduction circuit, a cutoff frequency using an RC (resistor-capacitor) circuit including C1 and R3 is applied. Here, the cutoff frequency may be determined according to Equation 1 below.

$$F_{cutoff} = \frac{1}{2\pi R_3 C_1} \quad \text{[Equation 1]}$$

In Equation 1, $F_{cutoff}$ represents a cutoff frequency, R3 represents a resistance value of resistor R3, and C1 represents a capacitance value of capacitor C1.

In this circuit, once the capacitor and the resistor selected according to determined capacitance and resistance values are mounted on a device, the capacitance of the capacitor cannot be changed thereafter. However, when the installation environment changes, the target noise to be reduced also changes accordingly. Somehow, desired noise reduction cannot be achieved since the cutoff frequency of the existing RC circuit cannot be changed.

As such, when applying an analog-to-digital converter within a BMS, a resistance and a capacitor capacity of the RC filter are selected in consideration of overall noise environment and ADC accuracy of the product. However, when a range of frequencies to be blocked varies depending on an installation environment and designing of an RC filter in consideration of frequency noise of all installation environments is needed, ADC accuracy is degraded, which makes the RC filter design difficult.

Figure 3:
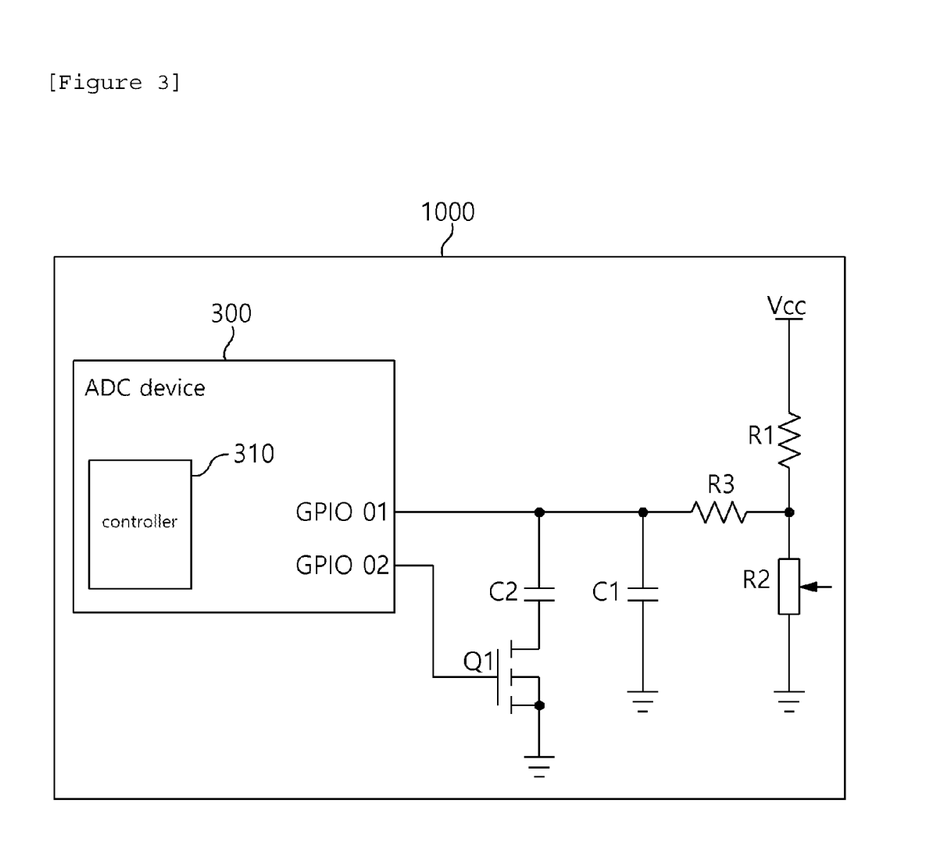
FIG. 3 shows a noise reduction circuit and a battery management apparatus according to embodiments of the present invention.

FIG. 3 shows a noise reduction circuit and a battery management apparatus according to embodiments of the present invention.

The noise reduction circuit according to embodiments of the present invention shown in FIG. 3 may include a first circuit including at least one resistance element and a first capacitor, and connected to an analog-to-digital converting device 300; and a second circuit connected in parallel with the first capacitor C1 and connected to the analog-to-digital converter through one or more input/output pins.

The first circuit may include one capacitor C1 and one or more resistors R3 in the same manner as a conventional noise cancelling circuit.

The second circuit may include a second capacitor (C2) connected in parallel with the first capacitor (C1) and a switch Q1 positioned between the second capacitor and the ground. Here, the second capacitor and the switch may be connected to the analog-to-digital converting device 300 through one or more input/output pins.

Here, the switch Q1 may be implemented as a field effect transistor (FET) device or a bipolar junction transistor (BJT) device.

In addition, a battery management apparatus 1000 according to embodiments of the present invention may comprise: an analog-to-digital converter including one or more input/output pins; a noise reduction circuit including a first circuit and a second circuit, the first circuit including at least one resistance element and a first capacitor and connected to the analog-to-digital converter, wherein the second circuit is connected in parallel with the first capacitor and connected to the analog-to-digital converter through the one or more input/output pins, and wherein the second circuit is activated or deactivated according to control of the analog-to-digital converter, so that a noise cutoff frequency generated by the first circuit and the second circuit is adjusted.

Here, the one or more input/output pins may include: a first general-purpose input/output (GPIO) for connecting the analog-to-digital converter and the second capacitor; and a second GPIO for connecting the analog-to-digital converter and the switch.

Referring to FIG. 3, the controller 310 in the analog-to-digital converting device may determine a cutoff frequency according to a frequency noise of an environment in which the battery management device is located, and determine whether to activate the second circuit according to the determined cutoff frequency. In FIG. 3, the analog-to-digital converting device may be a micro controller unit (MCU) or a battery monitoring integrated chip (BMIC). The analog-to-digital converting device may also be included in a micro controller unit (MCU) or a battery monitoring integrated chip (BMIC).

Here, the controller may transmit an activation signal or a deactivation signal for the second circuit to a switch Q1 of the second circuit through the second GPIO (GPIO 2). The switch receiving the activation signal is turned on so that the second capacitor C2 is connected to the first GPIO and the ground, and thus, the first capacitor and the second capacitor are connected in parallel. On the other hand, the switch receiving the inactivation signal for the second circuit is turned off and the second capacitor becomes in an OPEN state so that only the signal from the first circuit including the first capacitor and the resistance element is input to the first GPIO.

The cutoff frequency when the controller 310 deactivates the second circuit may be determined by the first circuit, and the cutoff frequency may be determined as defined in Equation 1 above.

On the other hand, when the controller 310 activates the second circuit, the first capacitor C1 of the first circuit and the second capacitor C2 of the second circuit are arranged in parallel, and, the total capacitor capacity for this case can be represented as (C1+C2).

Accordingly, the cutoff frequency generated by the first circuit and the second circuit may be determined according to equation 2 below.

$$F_{cutoff} = \frac{1}{2\pi R_3 (C_1 + C_2)} \quad \text{[Equation 2]}$$

In Equation 2, $F_{cutoff}$ represents the cutoff frequency, R3 represents a resistance value of resistor R3, C1 represents a capacitance value of capacitor C1, and C2 represents a capacitance value of capacitor C2.

In summary, the cutoff frequency provided by the first circuit and the second circuit according to embodiments of the present invention may be controlled as one of the first cutoff frequency (Equation 1) and the second cutoff frequency (Equation 2). In other words, the first noise cutoff frequency and the second noise cutoff frequency may be set to different values.

Meanwhile, in the embodiment of FIG. 3, a case where a monitoring target is a thermistor (R2) has been described as an example, but a BMS monitoring target may also be a voltage sensor or a current sensor. In this case, the analog signal detected by a corresponding device may be a voltage value or a current value.

Figure 4A:
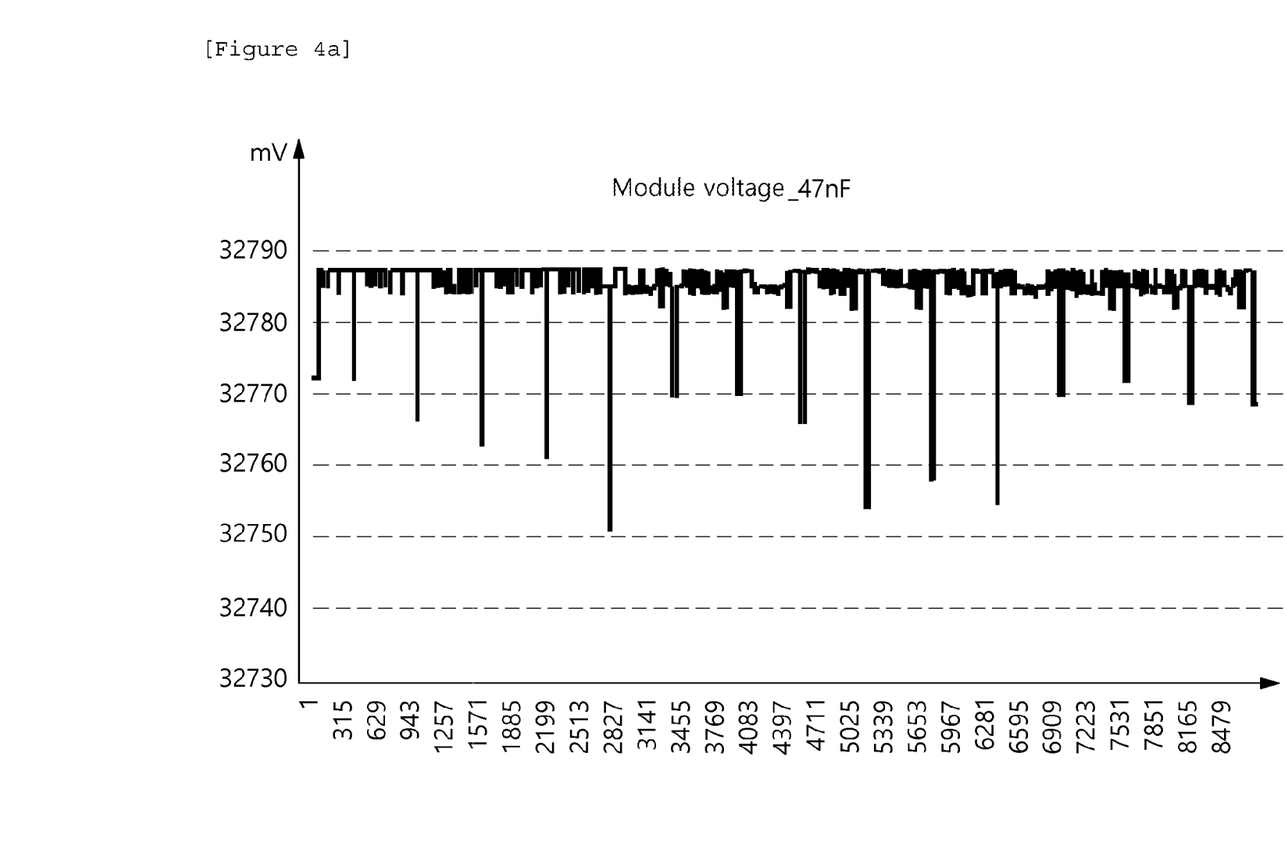
FIGS. 4A and 4B are graphs illustrating examples of ADC sensing data values with noise reduced using an RC filter.
Figure 4B:
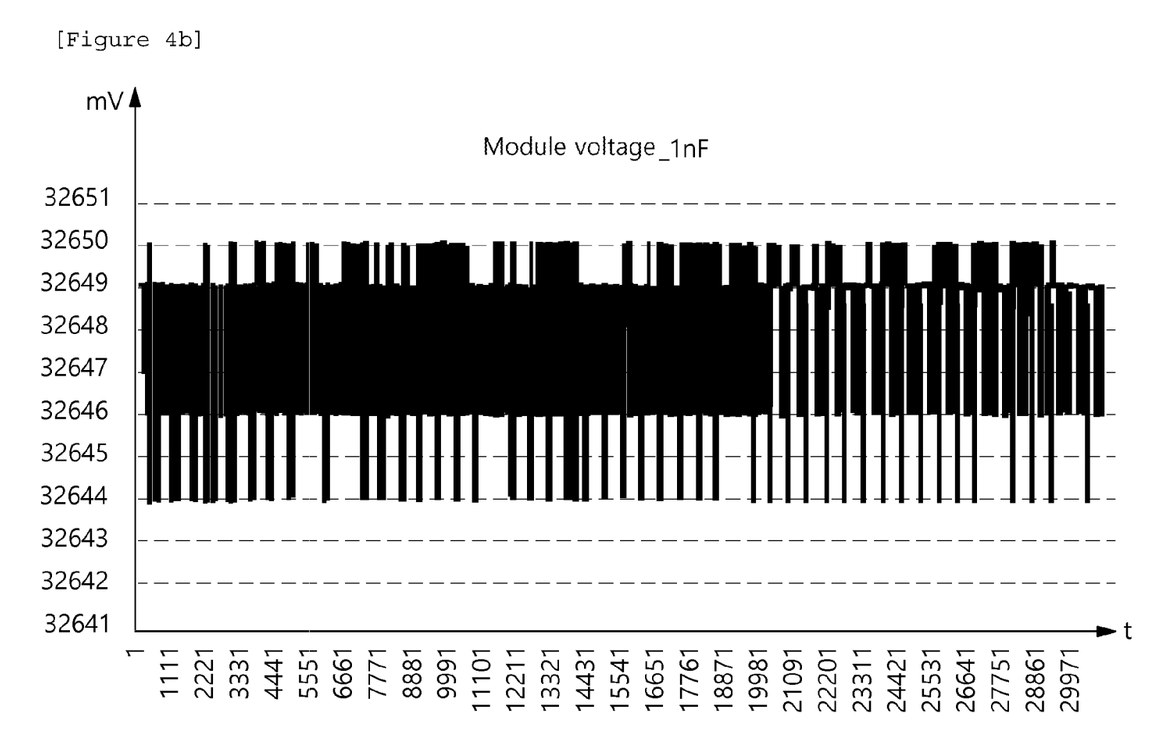

FIGS. 4A and 4B are graphs illustrating examples of ADC sensing data values with noise reduced using an RC filter.

Data sensed through the examples of FIGS. 4A and 4B are module voltages, the horizontal axis of the graph represents time (t), and the vertical axis represents a module voltage (mV). In the example of FIG. 4A, a capacitor having a capacity of 47 nF was used for a RC filter, and in the example of FIG. 4B, a capacitor having a capacity of 1 nF was used.

It can be understood from the graphs of FIGS. 4A and 4B that ADC performance may vary depending on a capacitance of an RC filter in the same circuit. For example, when a 47 nF capacitor is used, the deviation of the calculated module voltage value (the difference between the maximum value and the minimum value) is 4 mV, but when a 1 nF capacitor is used, the deviation of the calculated module voltage value is 0.5 mV. From this, it can be seen that the example of FIG. 4B is advantageous in terms of ADC performance.

On the other hand, in case of using a 1 nF capacitor, the cutoff frequency is 47 times larger than that of a 47 nF capacitor, and accordingly, it is difficult to block low-frequency noise.

Thus, the example of FIG. 4A using a capacitor of relatively high capacitance is advantageous for blocking low-frequency noise. Furthermore, the example of FIG. 4B using a capacitor of relatively low capacitance is advantageous in terms of ADC performance.

In summary, the capacitance of the capacitor can be differently applied by using a filter with a relatively low capacitance when it is necessary to secure ADC performance according to installation environments and end-user requirements and by using a filter with a relatively high capacitance when low-frequency noise reduction is particularly needed.

If these data are applied to the above-described embodiments of the present invention, a first circuit having a capacitor capacity of C1 may be applied in an environment requiring ADC performance, and a first circuit and a second circuit having a capacitor capacity of (C1+C2) may be applied in an environment requiring low-frequency noise reduction. In other words, the cut-off frequency can be variably controlled through an RC filter circuit implementation that inactivates the second circuit when securing ADC performance is required and that activates the second circuit when reducing low-frequency noise is required.

The embodiments of the present disclosure may be implemented as program instructions executable by a variety of computers and recorded on a computer readable medium. The computer readable medium may include a program instruction, a data file, a data structure, or a combination thereof. The program instructions recorded on the computer readable medium may be designed and configured specifically for the present disclosure or can be publicly known and available to those who are skilled in the field of computer software.

Examples of the computer readable medium may include a hardware device such as ROM, RAM, and flash memory, which are specifically configured to store and execute the program instructions. Examples of the program instructions include machine codes made by, for example, a compiler, as well as high-level language codes executable by a computer, using an interpreter. The above exemplary hardware device can be configured to operate as at least one software module in order to perform the embodiments of the present disclosure, and vice versa.

While the example embodiments of the present invention and their advantages have been described in detail, it should be understood that various changes, substitutions and alterations may be made herein without departing from the scope of the invention.

What is claimed is:

1. A noise reduction circuit comprising:
a first circuit including at least one resistance element and a first capacitor, and connected to a first sub-circuit including an analog-to-digital converter, the analog-to-digital converter including a first general-purpose input/output (GPIO) and a second GPIO, both the first and second GPIO including ports configured to communicate with components external to the analog-to-digital converter; and
a second circuit including a second capacitor connected in parallel with the first capacitor and a switch positioned between the second capacitor and a ground, the second circuit being connected in parallel with the first capacitor and connected to the first sub-circuit through the second GPIO,
wherein the second circuit is activated or deactivated according to control of the first sub-circuit, so that a noise cutoff frequency generated by the first circuit and the second circuit is adjusted,
wherein, when the second circuit is activated, a total capacitor capacity is a sum of a capacitance of the first capacitor and a capacitance of the second capacitor,
wherein the noise cutoff frequency is determined based on the total capacitor capacity,
wherein the first capacitor is directly connected to the ground,
wherein the first GPIO is configured to receive an input from the at least one resistance element and the first capacitor,
wherein the second GPIO is configured to output an activation or deactivation signal to the switch, and
wherein the output by the second GPIO does not loop back to the first GPIO through the second circuit.

2. The noise reduction circuit of claim 1, wherein the second capacitor and the switch are connected to the analog-to-digital converter through the second GPIO.

3. The noise reduction circuit of claim 1, wherein a first noise cutoff frequency generated by the first circuit differs from a second noise cutoff frequency generated by the first circuit and the second circuit.

4. The noise reduction circuit of claim 1, wherein a first resistance element among the at least one resistance element of the first circuit and the first capacitor is connected to the analog-to-digital converter through the first GPIO.

5. The noise reduction circuit of claim 2, wherein the switch is a field effect transistor (FET) or a bipolar junction transistor (BJT).

6. The battery management apparatus of claim 1, wherein a first noise cutoff frequency generated by the first circuit is higher than a second noise cutoff frequency generated by the first circuit and the second circuit.

7. The battery management apparatus of claim 1, wherein the switch and the second capacitor are located closer to the analog-to-digital converter than the first capacitor.

8. A battery management apparatus comprising:
an analog-to-digital converter including a first general-purpose input/output (GPIO) and a second GPIO; and
a noise reduction circuit including a first circuit and a second circuit, the first circuit including at least one resistance element and a first capacitor connected to the analog-to-digital converter through the first GPIO, and the second circuit including a second capacitor connected in parallel with the first capacitor and a switch positioned between the second capacitor and a ground, the second circuit being connected in parallel with the first capacitor and connected to the analog-to-digital converter through the second GPIO,
wherein the second circuit is activated or deactivated according to control of a first sub-circuit including the analog-to-digital converter, so that a noise cutoff frequency generated by the first circuit and the second circuit is adjusted,
wherein, when the second circuit is activated, a total capacitor capacity is a sum of a capacitance of the first capacitor and a capacitance of the second capacitor,
wherein the noise cutoff frequency is determined based on the total capacitor capacity,
wherein the first capacitor is directly connected to the ground,
wherein the first GPIO is configured to receive an input from the at least one resistance element and the first capacitor,
wherein the second GPIO is configured to output an activation or deactivation signal to the switch, and
wherein the output by the second GPIO does not loop back to the first GPIO through the second circuit.

9. The battery management apparatus of claim 8, wherein the second capacitor and the switch are connected to the analog-to-digital converter through the second GPIO.

10. The battery management apparatus of claim 9, wherein the analog-to-digital converter further includes a controller configured to determine a cut-off frequency according to frequency noise of an environment in which the battery management apparatus is located, and determine whether to activate the second circuit according to the determined cut-off frequency.

11. The battery management apparatus of claim 10, wherein the controller transmits the activation or the deactivation signal for the second circuit to the switch of the second circuit through the second GPIO.

12. The battery management apparatus of claim 8, wherein the analog-to-digital converter is included in a micro controller Unit (MCU) or in a battery monitoring integrated chip (BMIC).

* * * * *